United States Patent [19]
Cercone et al.

[11] Patent Number: 6,027,573
[45] Date of Patent: Feb. 22, 2000

[54] INDUSTRIAL CLEANING SPONGE APPARATUS AND METHOD FOR EXTRACTING RESIDUE FROM A SPONGE MATERIAL

[75] Inventors: Ronald J. Cercone, East Lyme; Gerald D. Ingram; Leon C. Nunier, both of Mystic, all of Conn.; Scott J. Quaratella, Westerly, R.I.

[73] Assignee: Xomed Surgical Products, Inc., Jacksonville, Fla.

[21] Appl. No.: 08/780,895

[22] Filed: Jan. 9, 1997

Related U.S. Application Data

[63] Continuation-in-part of application No. 08/319,005, Oct. 6, 1994, abandoned.

[51] Int. Cl.[7] .............................. C23G 1/02; B08B 9/00; B08B 3/00; A61L 2/00
[52] U.S. Cl. ............................ 134/28; 134/3; 134/22.19; 134/26; 422/22
[58] Field of Search ..................... 134/2, 3, 10, 22.16, 134/22.17, 22.19, 26, 28, 29; 422/12, 22; 604/36.9, 369; 521/54

[56] References Cited

U.S. PATENT DOCUMENTS

| | | |
|---|---|---|
| 1,002,842 | 9/1911 | Harriss . |
| 1,002,913 | 9/1911 | Harriss . |
| 1,094,361 | 4/1914 | Blevney . |
| 1,775,186 | 9/1930 | Bartling . |
| 2,053,604 | 9/1936 | Dullinger . |
| 2,485,428 | 10/1949 | Bleier et al. . |
| 2,932,859 | 4/1960 | Rockoff . |
| 3,858,329 | 1/1975 | Koide et al. . |
| 3,915,671 | 10/1975 | Kagawa . |
| 4,566,911 | 1/1986 | Tomita et al. . |
| 4,807,339 | 2/1989 | Hayashi . |
| 4,925,453 | 5/1990 | Kannankeril . |
| 5,009,652 | 4/1991 | Morgan et al. . |
| 5,414,914 | 5/1995 | Suzuki et al. . |

FOREIGN PATENT DOCUMENTS

| | | |
|---|---|---|
| 322878 | 10/1902 | France . |
| 1035021 | 7/1958 | Germany . |
| 13301 | of 1885 | United Kingdom . |

*Primary Examiner*—Jill Warden
*Assistant Examiner*—Yolanda E. Wilkins

[57] ABSTRACT

An industrial sponge device and a method of manufacturing the same. The sponge is made from a polyvinyl acetal material with a process in which the pores are formed by gas to provide an open pore structure having no fibrils. Additionally, the sponge is purified by alternating exposure of the partially cross-linked sponge to solutions of high pH and low pH. The sponge is sterilized by electron beam radiation to destroy micro organisms that can cause contamination of the final product. The resulting sponge material is formed into an industrial sponge having a cylindrical body and a plurality of projections extending from the body. The projections are tapered truncated cones having a cross-sectional radius that decreases with distance from the body.

7 Claims, 5 Drawing Sheets

INDUSTRIAL CLEANING SPONGE APPARATUS AND METHOD FOR EXTRACTING RESIDUE FROM A SPONGE MATERIAL

CROSS-REFERENCE TO RELATED PATENT APPLICATIONS

This application is a continuation-in-part of U.S. patent application Ser. No. 08/319,005 filed on Oct. 6, 1994 now abandoned, the disclosure of which is incorporated herein by reference.

BACKGROUND OF THE INVENTION

1. Field of the Invention

The present invention relates to an industrial sponge used for cleaning surfaces. More specifically, the invention is a synthetic industrial sponge made of polyvinyl acetal, and a method for extracting residue from the sponge to yield a sponge that leaves less particulate matter and has a longer life than conventional sponges.

2. Description of the Related Art

The use of synthetic sponges, made of polyvinyl acetal for example, is well known. For example, U.S. Pat. No. 4,566,911 discloses a scrubbing device using a polyvinyl acetal elastic material. Conventional sponges have been shaped in various forms, such as rollers and pads. These sponges are used to clean critical materials such as thin film disks, semiconductor wafers, data storage media, and other materials requiring removal of particles in the 0.1 micron range, i.e. "ultimate cleaning". Conventional synthetic sponges have a polymer structure with "dead end pockets" formed therein that trap residue and trace amounts of metals. As the sponge wears, these metals can come out of the sponge in the form of particulate matter. Such particulate matter can damage the surfaces that are to be cleaned. Further, this type of sponge has tiny fibrils in the pores thereof that are a result of spaces between the pore forming chemical additive during a cross-linking reaction. "Cross-linking" is the formation of ester bonding between chains of the two adjacent hydroxyl groups that occur with the reaction of polyvinyl alcohol and aldehyde. This reaction hardens and strengthens the resulting material.

U.S. Pat. No. 4,098,728, the disclosure of which is incorporated herein by reference, discloses a polyvinyl acetal sponge and a method for making the same. In this method, pore spaces in the sponge are formed by gas bubbles; not pore forming chemical additives such as starch/sulfate combinations. Because the sponge disclosed in this patent does not have any starch residue, or the like, it has been particularly useful in medical applications in which starch residues can cause a foreign body reaction when in contact with mucosal tissue.

Also, conventional sponges have been used to form rollers or the like having projections formed on a surface thereof. However, the conventional projections created have walls that extend perpendicular to an outer surface of the sponge body. Such a configuration creates stress concentration areas. Accordingly, the projections break off of the roller surface after continued use. Therefore, conventional sponges having projections have a short useful life.

SUMMARY OF THE INVENTION

It is an object of the invention to overcome the limitations of the prior art polyvinyl acetal sponges.

It is a further object of the invention to minimize particulate residue in a polyvinyl acetal sponge.

It is still a further object of the invention to extend the life of polyvinyl acetal sponges.

The invention achieves these objectives by forming a polyvinyl acetal sponge with a process in which the pores are formed by gas to provide an open pore structure having no fibrils. Additionally, the sponge is purified by alternating exposure of the partially cross-linked sponge to solutions of high pH and low pH. The sponge is sterilized by electron beam radiation to destroy micro organisms that can cause contamination of the final product.

The resulting sponge material is formed into an industrial sponge having a cylindrical body and a plurality of projections extending from the body. The projections are tapered truncated cones having a cross-sectional radius that decreases with distance from the body. The projections of the invention provide increased contact pressure without reducing the life of the industrial sponge to unacceptable levels.

DETAILED DESCRIPTION OF THE PREFERRED EMBODIMENT

Figure 1:
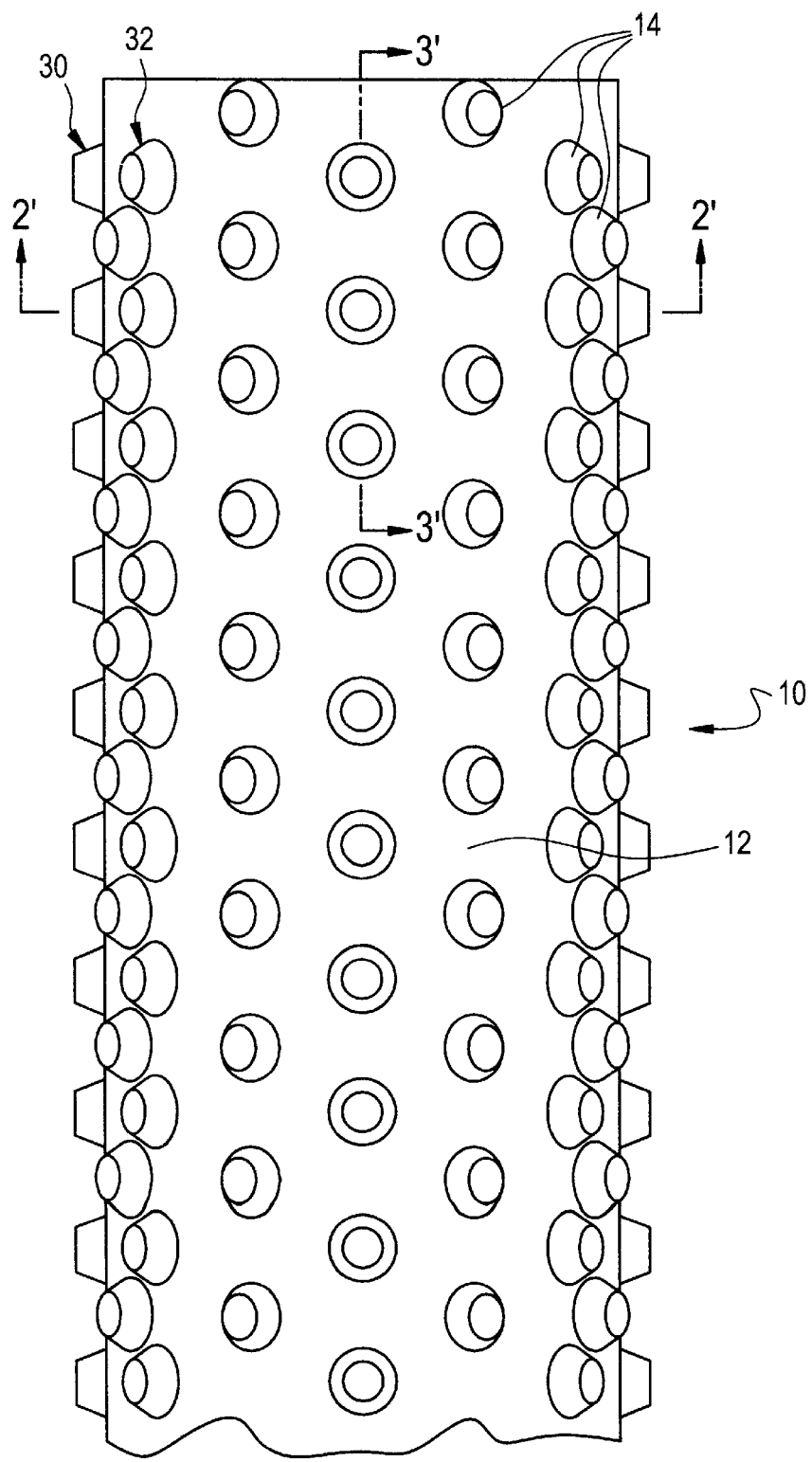
FIG. 1 is a perspective view of a sponge roller device according to a preferred embodiment of the invention.
Figure 2:
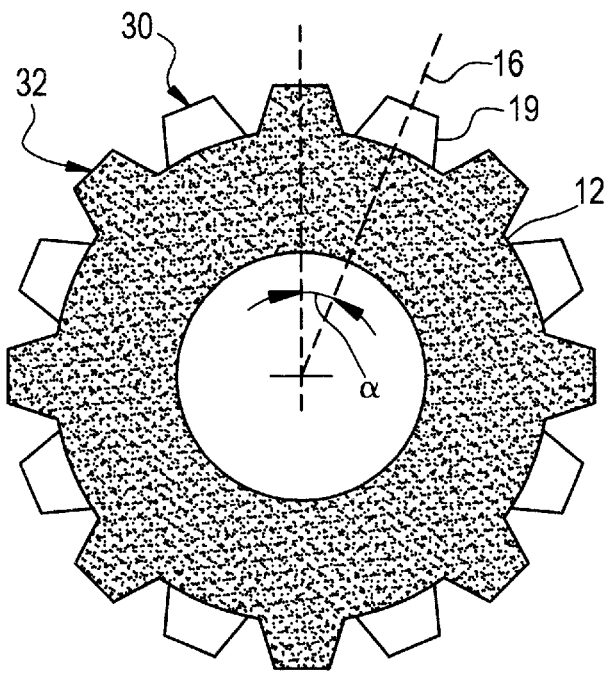
FIG. 2 is a cross-sectional view along line 2'—2' of FIG. 1.
Figure 3:
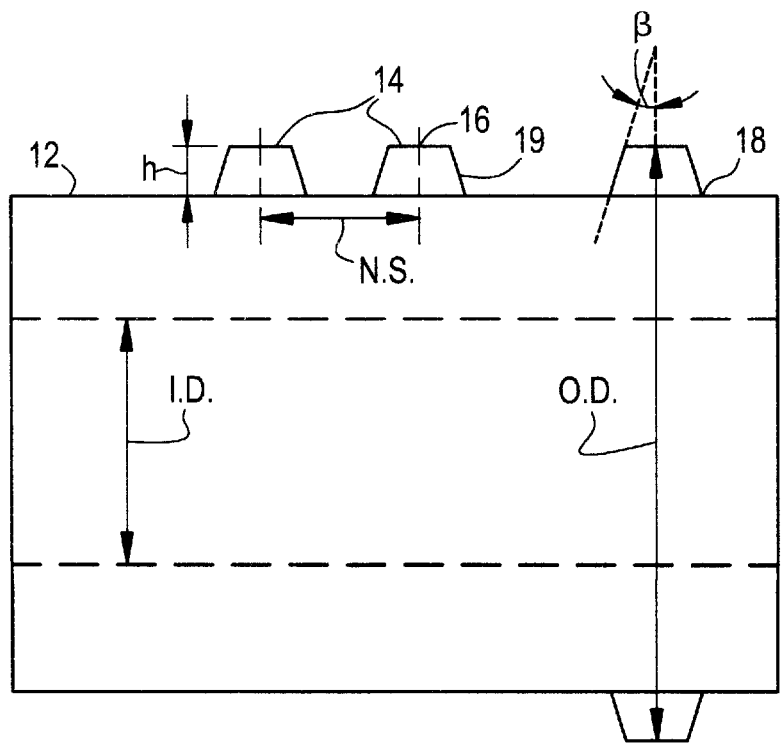
FIG. 3 is a partial cross-sectional view taken along line 3'—3' of FIG. 1.
Figure 4:
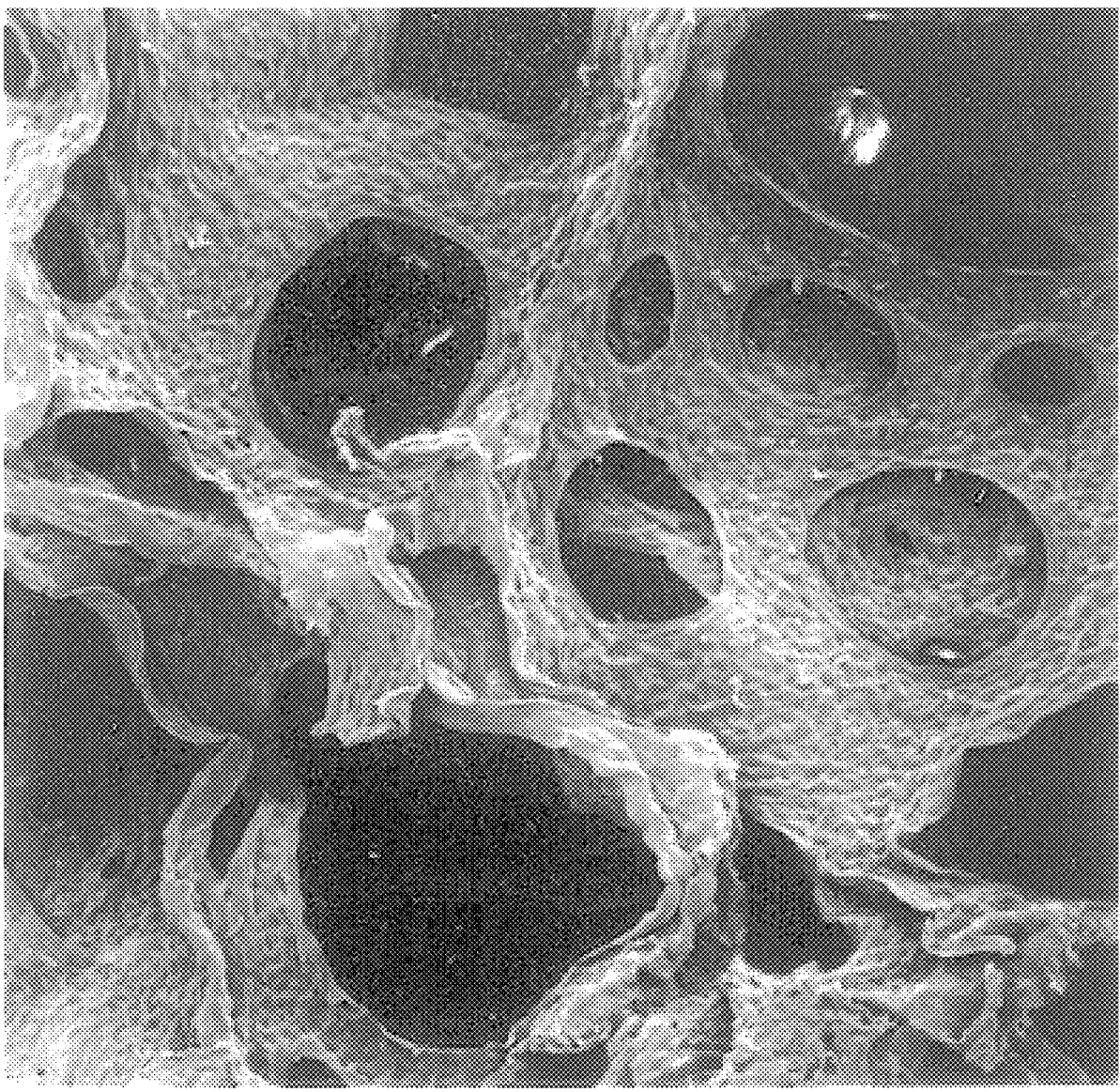
FIG. 4 is a micro photograph of the sponge material of the preferred embodiment.
Figure 5:
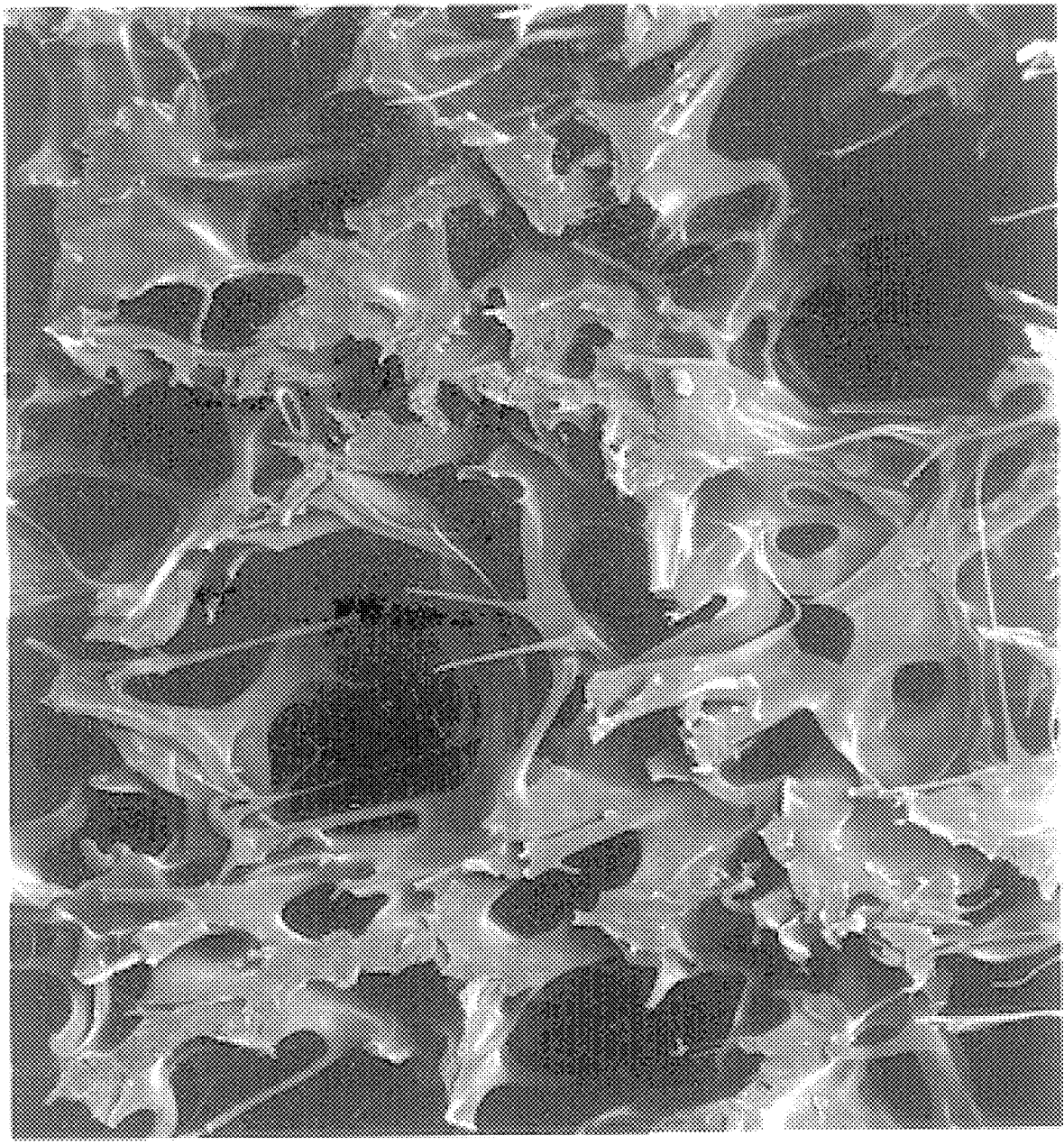
FIG. 5 is a microphotograph of a typical conventional sponge material.

A preferred embodiment of the invention is illustrated in FIGS. 1–3. Applicant has discovered that the sponge making process disclosed in U.S. Pat. No. 4,098,728, the disclosure of which is incorporated herein by reference, can yield a sponge material having 100% open pores with no "dead end pockets" and no fibrils. Specifically, the sponge material is a continuous porous web interconnected material lacking fibrils that can result from spaces between pore forming chemicals during conventional cross-linking reactions. In particular, fibrils are formed as uncross-linked polymer flows into the spaces existing between and around the agglomerated solid particles of starch/sulfate or other pore forming chemicals. As the cross-linking reaction proceeds, small incursions into these spaces become solidified as fibrils. FIG. 4 is a microphotograph of the sponge material used to form sponge roller device 10. The sponge material is formed of interconnected thin-walled structures with holes of substantially circular or oval cross section. The pore geometry of the sponge material does not contain micro fibers, i.e. fibrils, on the walls that define the pores. Also, the pore walls are attached to each other by a web-like membrane which is itself porous. In contrast, FIG. 5 illustrates the material used in cleaning and polishing rolls manufactured by Kanebo Corporation and distributed in the U.S. by Rippey, which is a typical conventional polyvinyl acetal sponge material. This material clearly contains tiny fibrils that were created by pore forming chemicals during a cross-linking reaction. These fibrils can come loose and fall as particulate matter onto the device being cleaned.

The specific geometry of the pores is a function of the reaction parameters, such as temperature, mixing technique, pore forming method, cure time, reactant concentration, catalyst type and concentration, flow rates, and the like, as described in the above-noted patent. An example of the sponge material that can be used for the invention is the same as that used to form the readily available Merocel Sponge™ and Merocel PVA Roller Brushes™ sold by Merocel Corporation which is made by the process disclosed in the patent. Additionally, applicant's have found that known continuous mixing techniques can be used in place of the mixing technique disclosed in the patent.

As illustrated in FIG. 1, sponge roller device 10 is molded to form a cylindrical body having outer surface 12 and a plurality of truncated conical projections 14 extending from outer surface 12. Projections 14 are disposed at regular intervals in rows 30 and 32 that are offset from one another, in a direction along the longitudinal axis of the cylindrical body, to result in a staggered arrangement of projections 14 as is best illustrated in FIGS. 1 and 2. Preferably, projections 14 extend from outer surface 12 to a height of approximately 0.1875 inches as illustrated in FIG. 3. Also, projections 14 preferably are disposed at intervals to define an angle α of 22.5° between radial lines extending through the central axes of adjacent offset projections as shown in FIG. 2. Preferably, the diameter of base 18 is at least 20% larger than the diameter of top surface 16. The area of base 18 is preferably 40% larger than that of top surface 16.

Each projection 14 has planar top surface 16 that has a diameter of 0.25 inches and thus an area of 0.049 square inches. Also, each projection 14 has base 18 having a diameter of 0.31 inches and thus an area of 0.073 square inches. The taper of projection walls 19, which define the outer surface of the truncated cone, defines an angle β that is in the range of 5–20°, inclusive, and is preferably about 10° with respect to the central axis of the projection as shown in FIG. 3. This tapered wall configuration provides a base for the projection that is sufficiently large and prevents stress concentration points to prevent reduced life of sponge roller device 10 due to broken projections 14. Also, the tapered wall configuration permits foreign matter on the object to be cleaned to enter readily between projections 14.

The sponge material is shaped into the sponge roller device 10 by a molding process. In particular, a polyethylene, ABS, or the like material is formed, through molding or the like, into a mold, i.e. a female version of the outer shape of the sponge roller device, with allowances for shrinkage, the amount of which can be determined experimentally. The mold can be made in separate segments and joined into one unit. The segments can be interlocked with one another and held together by end caps, or the like. The froth reactant of the sponge material is injected, or otherwise introduced, into the assembled mold and then the filled mold is placed in an insulated container where temperature is controlled during curing. This process is described in detail in U.S. Pat. No. 4,098,728.

The molded sponge material is then subjected to an extraction process to remove any trace amounts of metal and other residues that can cause particulate matter to fall out of the sponge material. The partially cross-inked, i.e 60% or less cross-linked, molded sponge roller is alternately exposed to solutions of high and low pH to precipitate metals from the pore spaces (high pH solutions) and dissolve trace amounts of metals (low pH solutions) from the pore spaces. Cross-linking in the range of 25–55% yields a strong, yet flexible sponge material. A first preferred extraction method includes the following steps:

1(a) soaking the rollers in water to dilute reactants and halt cross-linking, then washing rinsing and extracting the rollers until all acid catalyst is neutralized, i.e. a pH between 6.5 and 7.5 is reached; or 1(b) soaking the rollers in water and then passing the rollers through rubber rolls or the like to compress the rollers and thus extract any solution therefrom;

2) soaking the rollers in mineral acid at a concentration of 1 to 20% by weight (preferably between 1 and 5%) and washing and rinsing until all of the acid catalyst has been removed;

3) oxidizing unreacted aldehydes that are within the pore structure to form carboxylic acids and neutralizing the acids to soluble salts and washing and rinsing to remove the salts, while raising the pH beyond 7.0 to precipitates metals;

4) washing and rinsing to remove loosely held particulate matter;

5) washing with deionized water, extracting and rinsing, the last rinse being with distilled water.

A second alternative extraction process includes the following steps:

1) high turbulence washing and rinsing and then centrifugal extraction to remove all liquid;

2) exposure, through submersion or the like, to an acid solution of 0.1 to 10% (preferably 0.2 to 2.0%) of a mineral acid such as sulfric acid for 1 to 90 hours (preferably 4 to 48 hours).

3) more high turbulence washing and rinsing;

4) oxidation of reactant aldehydes by soaking the rollers in an oxidizing bath up to 10% concentration within adjustment for pH between 7.5 and 11 (preferably between 8.0 and 9.5 in a hydrogen peroxide bath at 0.05% to 2.0% concentration) for to 96 hours (preferably 4 to 36 hours).

5) repeat of steps 1–4 above until the pantanedione test, or a similar test, for alhehyde indicates less than 1.0 ppm HCO equivalent; and 6) sterilization by electron beam radiation to destroy microorganisms, such as mold spores, which can contaminate the final product.

Steps 1–5 above reduce residue to a very low value. Step 6 eliminates the need for pesticide or other additives for sterilizing the roller. These additives require an expensive washout procedure and can farther contribute to residue.

Figure 6:
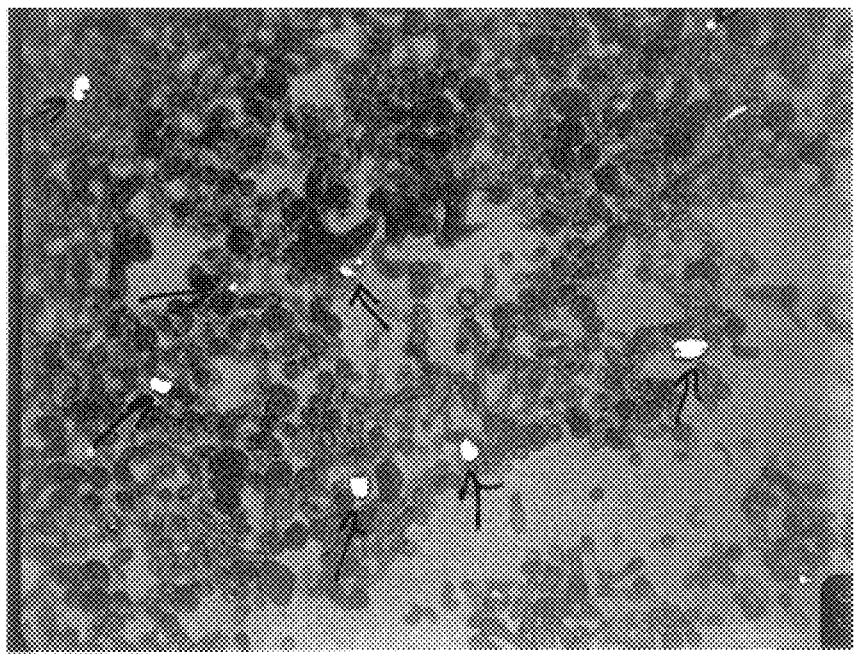
FIG. 6 is a microphotograph of the conventional sponge illustrating residual starch particles.
Figure 7:
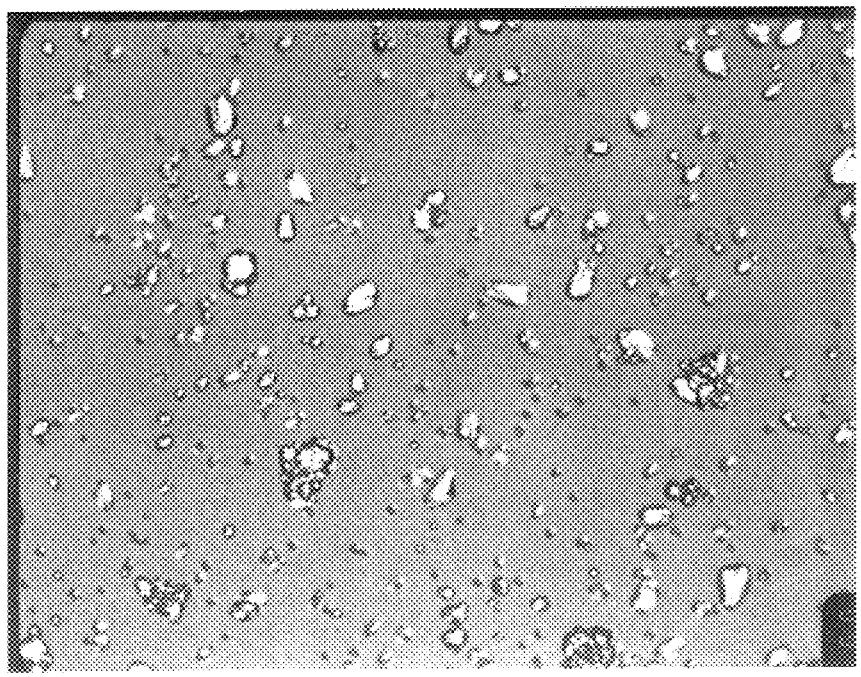
FIG. 7 is a microphotograph of the conventional sponge at 100× magnification illustrating the bi-refringent colorimetric method used to isolate the starch particles.

FIGS. 6 and 7 respectively illustrate residue (potato starch) remaining in the sponge material of the conventional sponge before use. The whitish spots in FIG. 6 are residue. FIG. 7 illustrates the bi-refringent colorimetric method used to isolate and detect the starch particles. Because the invention does not use starch to form pores, this residue is eliminated in the invention.

Comparative testing between the sponge roller device of the invention and the conventional sponge have been conducted. The first test was a measure of extractible residue contained in the sponge material. The results of this test are illustrated in Table 1 and Table 2 below.

TABLE 1

(First Extraction Process):

| COMPONENT | INVENTION | COMPETITIVE SPONGE |
|---|---|---|
| Calcium | 2.6 ppm | 2.6 |
| Chloride | not detected | 10 ppm |
| Magnesium | .17 ppm | .22 ppm |
| Potassium | .21 ppm | 6.3 ppm |
| Nitrate | 1.1 ppm | 1.3 ppm |
| Nitrite | not detected | not detected |
| Silicon | not detected | not detected |
| Sodium | 3.4 ppm | 5.8 ppm |
| TNVR | 36 ppm | 39 ppm |

TABLE 2

(Second Extraction Process):

| COMPONENT | INVENTION | COMPETITIVE SPONGE |
|---|---|---|
| Calcium | 0.2 ppm | 2.60 ppm |
| Potassium | 0.03 ppm | 6.30 ppm |
| Nitrate | 0.3 ppm | 1.30 ppm |
| Total Non Volatile Residues | Not Detected | 39.0 ppm |

From the test results above, it is clear that the invention has far less extractable residue than the competitive product. Additionally particulate analysis testing was conducted on a sponge of the preferred embodiment and a conventional sponge. Both the IES-RP-004 biaxial shake test and the IES-RP-004 new zero mechanical stress test were used. These test results are presented in Table 3 and Table 4 below.

TABLE 3

(Biaxial Shake Test):

| | Competitive Sponge | Invention Using First Extraction Process | Invention Using Second Extraction Process |
|---|---|---|---|
| Number of Particles Released per cm2 | 338,725 | 25,301 | 12,074 |

TABLE 4

(New Zero Mechanical Stress Test):

| | Competitive Sponge | Invention Using First Extraction Process | Invention Using Second Extraction Process |
|---|---|---|---|
| Number of particles Released per cm2 | 37,140 | 1,462 | 982 |

The test results above show that the particulate matter released by the invention is substantially lower than that of the competitive device. Therefore, the invention is less likely to damage or contaminate the surface that is to be cleaned.

The rinsing processes can be used to purify other sponge materials, such as that of the competitive product. However, the results may not be as good because the prior art has closed pores and fibrils as noted above. Also, the extraction processes can be applied to sponges rollers that do not have projections or that have different shaped projections. Further, the extraction process and disclosed sponge material can be applied to pads or other cleaning apparatus that are not rollers.

The invention has been described through a preferred embodiment. However, it will be apparent the various modifications can be made without departing from the scope of the invention as defined by the appended claims.

What is claimed:

1. A method for extracting particulate residue and aldehydes from an industrial sponge material comprising, in order, the steps of:

a) washing and rinsing the material a first time;

b) removing all liquid from the material;

c) contacting the material with an acid solution;

d) washing and rinsing the material a second time;

e) exposing the material to an oxidizing solution to oxidize un reacted aldehydes in the material;

f) repeating steps (a) through (e) until the material contains less than 1.0 ppm HCO equivalent.

2. The method as recited in claim 1, further comprising the step of:

sterilizing the material by irradiating the material with electron beam radiation subsequent to step (f).

3. The method as recited in claim 2, wherein said acid solution is 0.1 to 10% by weight of a mineral acid.

4. The method as recited in claim 2, wherein said acid solution is 0.2 to 2.0% by weight of a mineral acid.

5. The method as recited in claim 2, wherein said oxidizing solution has a pH of 7.5–11.

6. The method as recited in claim 2, wherein said oxidizing solution has a pH of 8.0–9.5.

7. The method as recited in claim 2, further comprising the steps of:

(g) washing and rinsing the material in deionized water; and (h) rinsing the material with distilled water.

* * * * *